United States Patent [19]
Miyake et al.

[11] 4,423,403
[45] Dec. 27, 1983

[54] TRANSPARENT CONDUCTIVE FILMS AND METHODS OF PRODUCING SAME

[75] Inventors: Kiyoshi Miyake; Naoyuki Miyata, both of Ube, Japan

[73] Assignees: Hitachi, Ltd.; Kiyoshi Miyake, both of Tokyo, Japan

[21] Appl. No.: 369,078

[22] Filed: Apr. 16, 1982

Related U.S. Application Data

[62] Division of Ser. No. 936,124, Aug. 23, 1978, Pat. No. 4,349,425.

[30] Foreign Application Priority Data

Sep. 9, 1977 [JP] Japan ............................ 52-107984
Jul. 7, 1978 [JP] Japan ............................ 53-81881

[51] Int. Cl.³ .......................................... H01L 31/08
[52] U.S. Cl. .................................. 338/15; 204/192 P
[58] Field of Search .......... 338/15; 204/192 P, 192 F; 252/518; 250/211 K

[56] References Cited

U.S. PATENT DOCUMENTS 3,811,953 5/1974 Nozik ............................ 204/192 P Primary Examiner—C. L. Albritton
Attorney, Agent, or Firm—Antonelli, Terry & Wands

[57] ABSTRACT

Cadmium-tin oxide films are prepared by d-c reactive sputtering of Cd-Sn alloys in Ar-O₂ mixtures. The films obtained have low resistivity of the order of $10^{-3}-10^{-4}$ $\Omega$-cm and high optical transparency depending upon deposition conditions.

8 Claims, 19 Drawing Figures

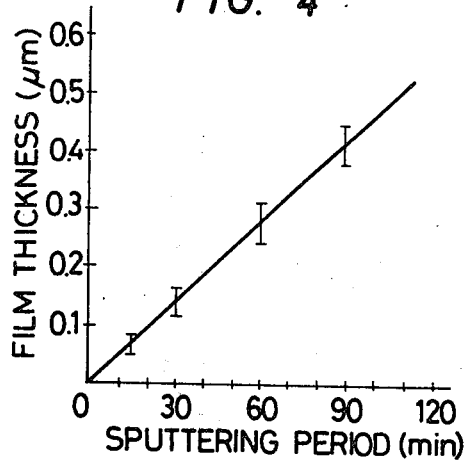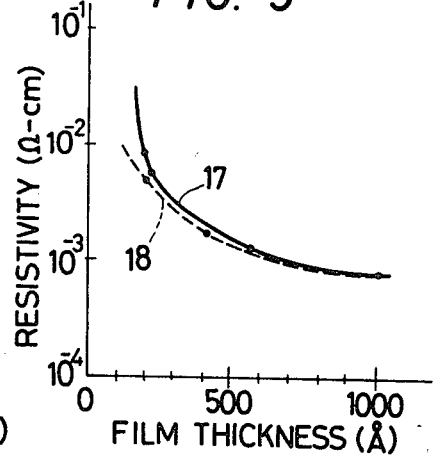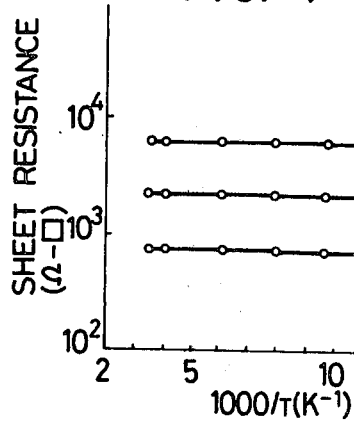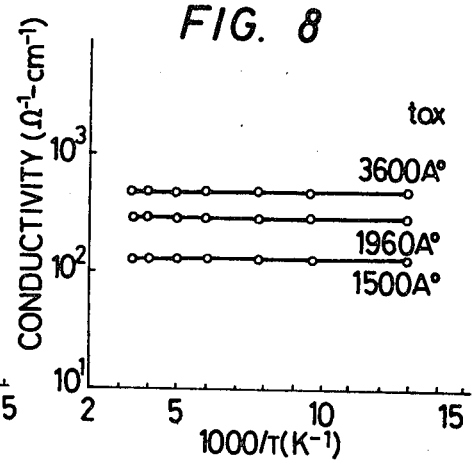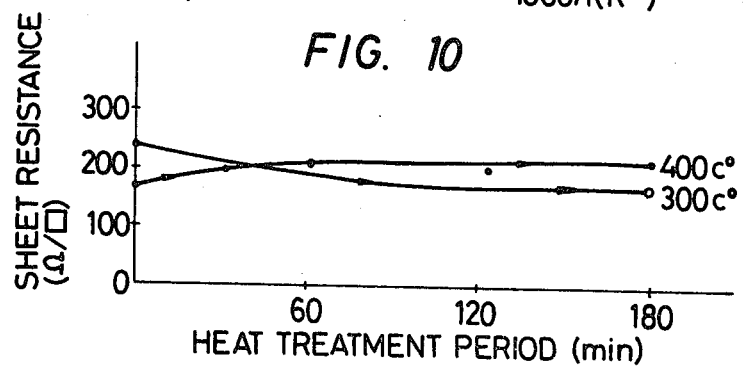

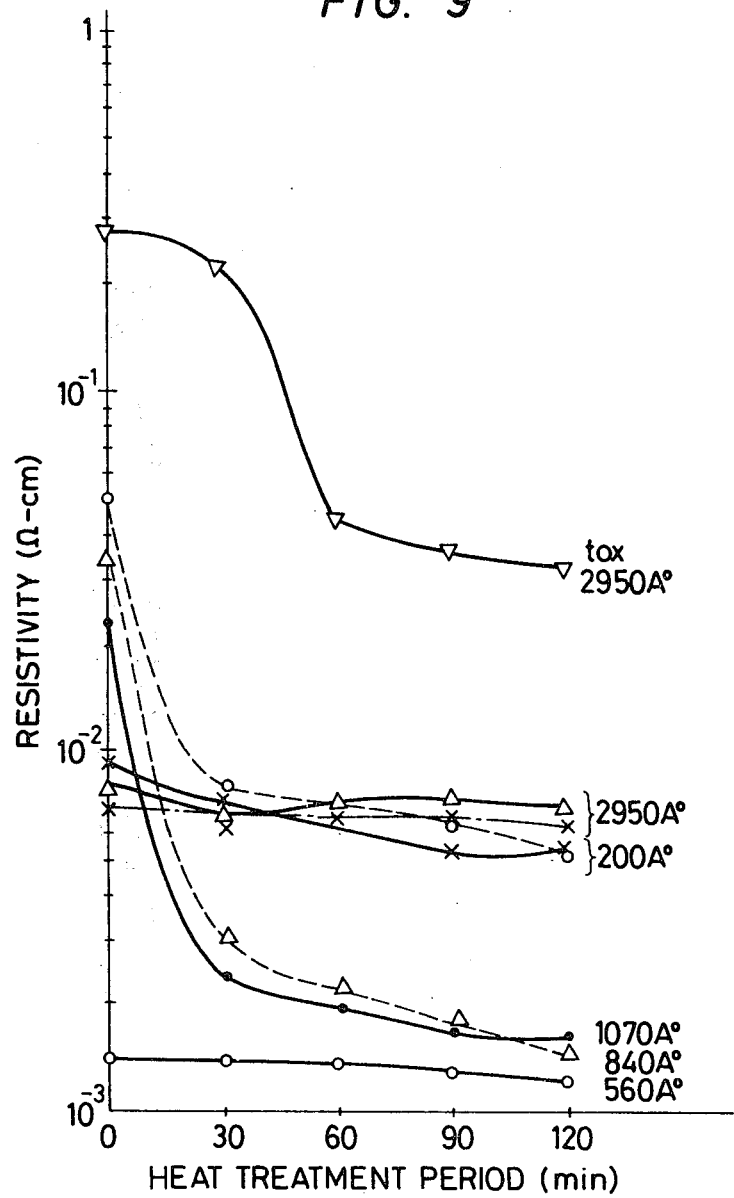

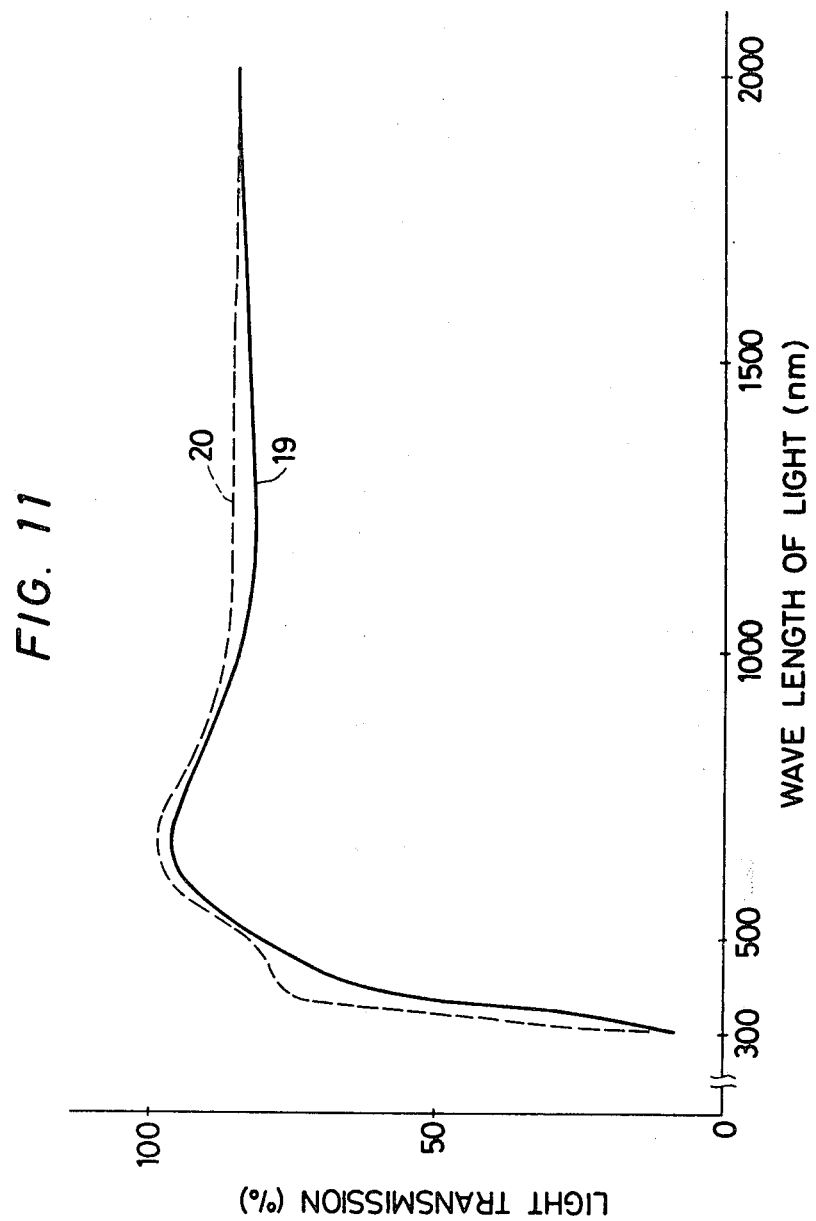

TRANSPARENT CONDUCTIVE FILMS AND METHODS OF PRODUCING SAME

This is a division of application Ser. No. 936,124, filed Aug. 23, 1978, now U.S. Pat. No. 4,349,425.

BACKGROUND OF THE INVENTION

1. Field of the Invention

The present invention relates to transparent conductive films, particularly to cadmium-tin oxide films, and a method of producing same.

2. Description of the Prior Art

Metal oxide transparent conductive films which are now used for photoelectric converters such as solar cells and solid image pickup devices, or display devices such as liquid crystal display boards, can be grouped into three types: those of the type $SnO_2$, those of the type $In_2O_3$ and those of the type $Cd_2SnO_4$. Among them, although the transparent conductive films of the types $SnO_2$ and $In_2O_3$ have long been studied, the transparent conductive films of the type $Cd_2SnO_4$ have a recent history of study. It is only in recent years that the methods for their preparation and their characteristics have been reported as in Applied Physics Letters, Vol. 28, No. 10, p. 622, 1976, Physical Review, B, Vol. 6, No. 2, p. 453, 1972, and U.S. Pat. No. 3,811,953.

However, the transparent conductive films of $Cd_2SnO_4$ have been formed by a high-frequency a-c sputtering method using a target made by molding under pressure and sintering a mixture of a $Cd_2SnO_4$ powder or an $SnO_2$ powder and a CdO powder, thus requiring cumbersome operation for preparing the target, also the handling of the apparatus for preparing the films to be sputtered and maintenance thereof, and eventually making it difficult to prepare the films having the desired compositions. It was therefore difficult to prepare the transparent conductive films having the desired characteristics such as film thickness, specific resistivity, transmission factor of light, and temperature dependence of the resistance, while maintaining good reproduceability.

In applying transparent conductive films to the abovementioned various electronic devices, increasing demand has been placed on highly sophisticated characteristics such as low specific resistivity of the transparent conductive films, great transmission factor of light, low temperature dependence of the resistance, and uniform characteristics over wide areas.

SUMMARY OF THE INVENTION

The present invention proposes to satisfy such requirements, and its primary object is to provide transparent conductive films each having excellent electrical or physical properties.

Another object of the present invention is to provide transparent conductive films having very small specific resistivity.

A further object of the present invention is to provide transparent conductive films which can be obtained using an easily prepared target, requiring a simple manufacturing operation and maintenance.

A still further object of the present invention is to provide transparent conductive films which enable the electrical or physical properties of the formed films to be easily controlled.

Another object of the present invention is to provide a novel industrial method of producing transparent conductive films requiring simple manufacturing steps.

BRIEF DESCRIPTION OF THE DRAWINGS

FIG. 4 is a graph showing a relation between the sputtering time and the thickness of the sputtered film;

FIG. 5 is a graph showing a relation between the thickness of the sputtered film and the specific resistivity;

FIG. 7 and FIG. 8 are graphs illustrating the resistivity of the sputtered film and the temperature dependence of the conductivity;

FIG. 9 and FIG. 10 are graphs illustrating relations between the heat-treating time after the sputtered film has been formed and the specific resistivity;

FIG. 11 is a graph for illustrating the change in spectral transmission coefficient of light before and after the sputtered film is heat-treated;

DESCRIPTION OF THE PREFERRED EMBODIMENTS

Illustrated below, in detail, is the procedure for forming a cadmium-tin oxide film according to the present invention.

1. Preparation of target

Since the present invention employs a d-c bipolar sputtering device which will be described later, the substances to be sputtered must have electrical conductivity. The target formed of an alloy of cadmium and tin is prepared by the following procedure:

(a) Cadmium (Cd) is etched on its surface with nitric acid, and tin (Sn) is etched on its surface with a mixture solution of nitric acid and hydrofluoric acid; the cadmium and the tin are then washed with distilled water.

(b) The cadmium and the tin are then dried. 68.980 grams of cadmium and 36.416 grams of tin are prepared such that the molar ratio of cadmium to tin is 2 to 1.

Figure 1:
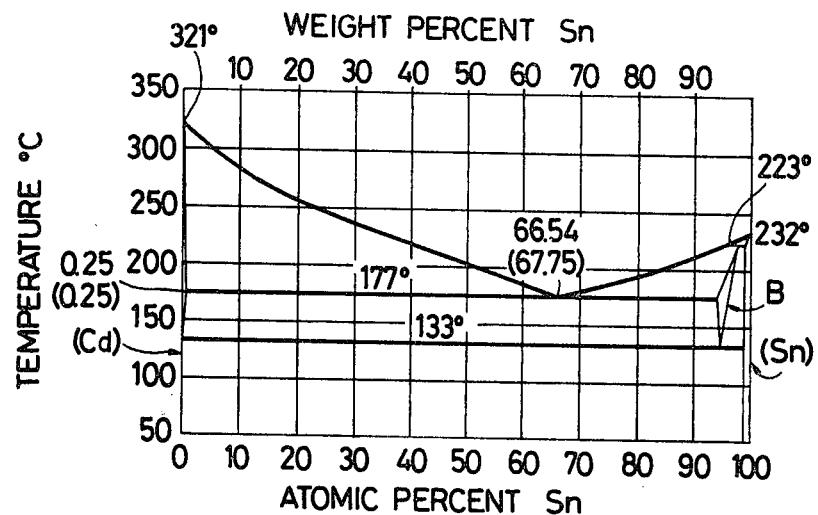
FIG. 1 is a phase diagram of Cd-Sn.

(c) The thus prepared cadmium and tin are introduced into a laboratory dish in open air, mixed together sufficiently with vibration on a hot plate, heated at about 177° C. to melt them, and quickly cooled to prepare a target of Cd-Sn alloy in the shape of a disc having a diameter of 64 mm and a thickness of 3 mm. Here, the melting temperature is selected to be 177° C., because when the molar ratio of Cd to Sn is 2 to 1, their eutectic point is 177° C. as will be understood from the phase diagram of Cd-Sn of FIG. 1.

2. Sputtering device

Figure 2:
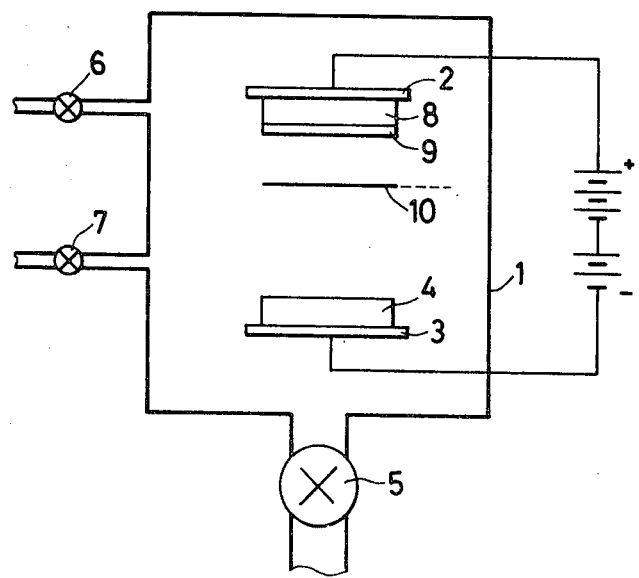
FIG. 2 is a schematic view showing the principal elements of the sputtering device.

According to the present invention, a device similar to a customarily employed cathode-sputtering device using a d-c power supply is employed to prepare a transparent conductive film based on the reactive cathode-sputtering method. FIG. 2 shows the principle of such a sputtering device, in which reference numeral 1 represents a vessel made of a glass or a metal in which will take place a low-vacuum gas discharge, 2 an anode made of a metal which is maintained at a positive d-c potential higher than 1 kilovolt, and 3 a cathode made of a metal on which will be placed an alloy composed of metals for forming the abovesaid transparent conductive film, i.e., a disc-shaped target 4 made of Cd-Sn alloy. The cathode 3 and the target 4 together are maintained at a negative d-c potential. Reference numeral 5 denotes a vacuum valve connected to an exhaust device (not shown) such as an oil-diffusion pump, trap or the like to take out gases from the vessel. Reference numeral 6 represents a leak valve for introducing an inert gas such as argon (Ar) into the vessel 1 in a steadily flowing manner after the air in the vessel 1 has been exhausted to a high degree of vacuum, and reference numeral 7 designates a leak valve for introducing an active gas such as oxygen or the like into the vessel 1 in a steadily flowing manner. Reference numeral 8 designates a substrate on which surface will be formed the sputtered film. The substrate 8 will consist of a glass plate for accumulating the transparent conductive film, or a silicon wafer such as a photoelectric device having on its main surface a PN junction, and is heated at a predetermined temperature by a suitable heating means which is not shown. Reference numeral 9 denotes the transparent conductive film accumulated on the substrate 8, and 10 a shutter for preventing the surface of the substrate 8 from being fouled before the film is formed.

3. Preparation of transparent conductive film

Using the device shown in FIG. 2, the transparent conductive film is prepared by the following procedure. First, the target 4 is secured onto the cathode 3, and the substrate 8 (such as slide glass) is fitted to the lower surface of the anode 2 using a suitable holder fitting and is heated to about 200° C. The operation consists of starting an exhaust device (not shown), and opening the vacuum valve 5 to remove the air or gases from the vessel 1 in order to maintain the interior of the vessel in a vacuum state of a pressure lower than $10^{-5}$ Torr (preferably less than $5.0 \times 10^{-6}$ Torr). Then, as an inert gas for sputtering the target material, argon (Ar) is introduced into the vessel 1 by opening the leak valve 6. According to the present invention, argon is used as an inert gas, because in d-c sputtering the target made of an alloy, it operates to relatively stably maintain the discharge and further allows the sputtered film to accumulate at a relatively high rate. The leak valve 7 is then opened to introduce oxygen as an active gas. Usually, the total pressure of gases introduced into the vessel 1 lies in a range from $10^{-3}$ to $10^{-1}$ Torr (desirably, about $10^{-2}$ Torr). The partial pressure of oxygen which, is a part of the total pressure, can be precisely controlled by manipulating the leak valves 6 and 7, as will be mentioned later.

Under this condition, a d-c voltage higher than 1 kilovolt (preferably, 2 kilovolts to 2.5 kilovolts) is applied across the anode 2 and the cathode 3. The distance between the anode and the cathode will be several centimeters (5.7 cm in practice). The surface of the substrate 8 is covered by the shutter 10 until a suitable period of time passes after the discharge has taken place. If the shutter 10 is opened, the metal atoms of cadmium and tin are sputtered from the alloy target of a predetermined composition, i.e., from the target of Cd-Sn alloy. The metal atoms then react with oxygen gas to form oxides which will be accumulated on the surface of the substrate 8 that is heated at about 200° C., thereby forming film 9.

The composition of the film being accumulated is controlled, maintaining good reproducibility owing to the alloy composition or the composition of the mixture gas in the vessel. When only the inert gas is introduced, a film of Cd-Sn alloy is accumulated on the substrate, and when the inert gas and oxygen gas are introduced together, a film of an oxide semiconductor or an insulating substance having a composition dependent upon the mixing ratio of the gases is accumulated, as will be mentioned later. The transmission factor of light of the accumulated film the visible light range can also be arbitrarily selected up to the range of opaque areas maintaining good reproducibility.

In practice, if a so-called flowing system equipped with a mixer is employed instead of adjusting the partial pressure or total pressure by means of the leak valves 6, 7 and exhaust valve 5, it is possible to more desirably carry out the reactive sputtering under the condition in which the mixing ratio is maintained always constant with a constant flow rate of gas.

4. Heat-treatment of accumulated film

In order to examine the effects of heat-treatment on the characteristics of the film 9 accumulated on the substrate 8, the substrates (slide glasses) 8 having the accumulated film 9 are treated with heat at a temperature over the range of from about 200° C. to 400° C. in a vacuum a a pressure less than $4 \times 10^{-6}$ Torr and in argon gas at a pressure reduced to less than $5 \times 10^{-2}$ Torr. In this testing, characteristics of the film 9 are examined before and after the heat-treatment.

5. Measurement of characteristics of film

Figure 3A:
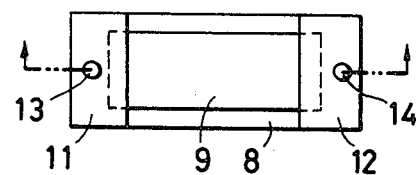
FIGS. 3-(a), 3-(b) and 3-(c) are, respectively, a plan view, a cross-sectional view and a plan view showing a substrate having a sputtered film on the surface.
Figure 3B:
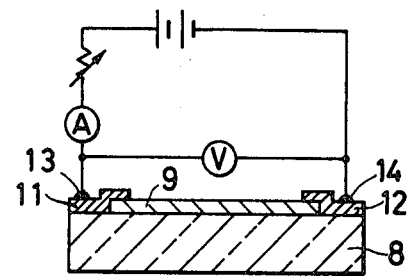

A specimen is prepared as shown in FIGS. 3-(a) and 3-(b) in order to measure the specific resistivity of the accumulated film formed as mentioned above. In the drawings, reference numerals 11 and 12 denote metal electrodes formed on the substrate (slide glass) 8 and on the film 9 by the technique of vaporisation, and reference numerals 13 and 14 denote silver paste for connecting lead wires for measurement to the metal electrodes.

The Hall effect of the accumulated film 9 is measured by preparing a sample having measuring terminals (silver paste) 15 and 16 as shown in FIG. 3-(c).

6. Various processing conditions and results of measured characteristics (1) Sputtering time and film thickness:

FIG. 4 is a graph of measured characteristics showing a relation between the sputtering time and the thickness of the film 9 when the target of Cd-Sn alloy is sputtered under the conditions of a total pressure of $6.0 \times 10^{-3}$ Torr in the vessel 1, argon-to-oxygen mixing ratio of 4 to 1, and a d-c voltage across the anode and the cathode of 2 kilovolts. As will be understood from the diagram, the thickness of the film is proportional to the sputtering time. Slight dispersion in the thickness of the film is probably due to the stability of the discharge.

(2) Film thickness and specific resistivity:

FIG. 5 shows a relation between the thickness of the accumulated film 9 and the specific resistivity before and after the heat-treatment of the accumulated film which is formed by sputtering the target of Cd-Sn alloy under the conditions of a total pressure of $3.0 \times 10^{-2}$ Torr in the vessel 1, the argon-to-oxygen mixing ratio of 4 to 1, and a d-c voltage applied across the andoe and the cathode of 2 kilovolts. Solid line 17 represents a characteristic curve before the film is heat-treated, and the dotted line 18 represents a characteristic curve after the film is heat-treated at about 300° C. in argon or under a vacuum condition. As will be understood from the diagram, if the film thickness is as thin as 200 angstroms or less, the specific resistivity greatly depends upon the film thickness. However, if the film thickness is greater than about 500 angstroms, the specific resistivity depends less upon the film thickness; this tendency does not differ much even before or after the heat-treatment.

(3) Dependence of specific resistivity upon the partial pressure of oxygen:

Properties of the Cd-Sn oxide films formed by reactive sputtering using the Cd-Sn alloy target of the present invention are affected by the degree of partial pressure of oxygen in the vessel 1. In other words, if the composition of the target material is fixed, it is possible to obtain a transparent conductive film composed of a Cd-Sn oxide film having desired specific resistivity, etc., while maintaining good reproducibility simply be controlling the amount of active gas or ratio of partial pressures in the atmosphere during the discharging and sputtering.

Figure 6:
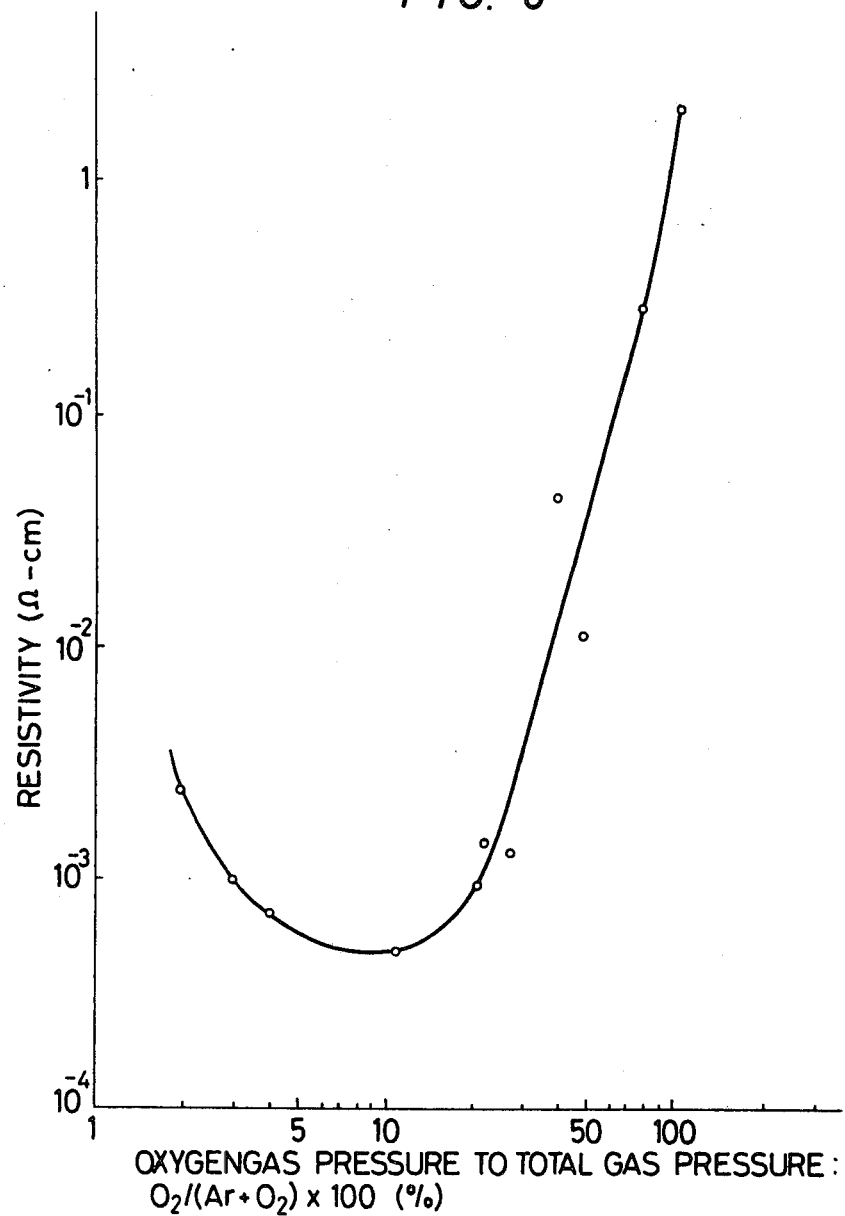
FIG. 6 is a graph showing a relation between the partial pressure of oxygen and the specific resistivity.

FIG. 6 is a graph of characteristics showing a relation of specific resistivity of the film with respect to various partial pressures of oxygen (i.e., $O_2/(Ar+O_2) \times 100\%$) when the Cd-Sn oxide film of a thickness of about 500 to 900 angstroms is formed by sputtering on the slide glass 8 from the Cd-Sn alloy target under the conditions of a total pressure of the atmosphere in the vessel 1 of $0.6 \times 10^{-2}$ Torr which is constant and a d-c voltage across the anode and the cathode of 2 kilovolts. The relation between the partial pressure of oxygen and the specific resistivity is also similar to the abovementioned relation even when the total pressure in the vessel is changed over a range of from $10^{-1}$ to $10^{-3}$ Torr. As will be understood from FIG. 6, the specific resistivity becomes minimal when the ratio of the partial pressure of oxygen to the total pressure is about 10%, making it possible to form a transparent conductive film composed of Cd-Sn oxide having a resistivity of $4.78 \times 10^{-4}$ Ω-cm. Further, by setting the partial pressure of oxygen within a range of from about 5% to about 15%, it is possible to obtain a transparent film having a good conductivity and a constant resistivity regardless of variation in the partial pressure of oxygen. Moreover, from the viewpoint of applying films to the electronic devices, it is necessary to form a transparent conductive film having a specific resistivity less than $10^{-3}$ Ω-cm. By setting the partial pressure of oxygen within a range of from about 3 to about 20%, however, it is possible to minimize variation in specific resistivity.

(4) Temperature characteristics of resistivity and conductivity at low temperature regions:

FIG. 7 and FIG. 8 show the temperature characteristics of resistivity and temperature characteristics of conductivity in open air of the transparent conductive films formed in an atmosphere of $Ar/O_4=4/1$ over a temperature range of from room temperature (288° K.) down to a temperature of liquid nitrogen (77° K.). As will be understood from these drawings, the films exhibits almost no dependence upon the temperature irrespective of the thickness of the films. Although the ambient temperature was lowered from 288° K. to 77° K., and was raised again to 288° K. the films exhibited almost no thermal history. The abbreviation "tox" used in FIGS. 7–9 refers to the thickness of the Cd-Sn oxide film.

(5) Effects of heat-treatment and spectral transmission factor of light:

FIG. 9 shows the measured specific resistivities of films sputtered under a total gas pressure of $3.0 \times 10^{-2}$ Torr, and an $Ar/O_2$ ratio of 4 to 1, and treated with heat at 300° C. in argon of a pressure of $5.0 \times 10^{-2}$ Torr or under a vacuum of $0.5 \times 10^{-5}$ to $3.0 \times 10^{-5}$ Torr. In the drawing, the curves of solid lines show relations between the specific resistivity and the heat-treating time under the vacuum condition, and the curves of dotted lines show the change in specific resistivity due to heat-treatment in the argon gas. As will be understood from FIG. 9, when heat-treated at 300° C., the resistivity of some films is suddenly decreased, and the resistivity of some films remains almost constant. Little difference is exhibited by the heat-treatment in the argon gas and oxygen gas. Further, the resistivity increases as shown in FIG. 10 if the sample which has acquired a nearly constant specific resistivity by heat-treatment for 3 hours is heat-treated again at 400° C.

FIG. 11 shows in comparison the measured transmission factors of light before and after the film is heat-treated. The samples used for this measurement were prepared by heat-treating (annealing) the sputtered film in an inert gas atmosphere of argon gas, etc. ($5.0 \times 10^{-2}$ Torr) at 300° C. for 6 hours, said film being formed under the conditions of a total gas pressure of $3.0 \times 10^{-2}$ Torr, and $Ar/O_2$ ratio of 4/1. In the drawing, solid line 19 shows the characteristics before the sample was heat-treated, and a dotted line 20 shows the characteristics after the sample was heat-treated. As will be understood from the drawing, the heat-treatment contributes to strikingly increase the transmission factor for light of wavelengths from about 300 to 500 nm. It has been confirmed that the abovesaid phenomenon is exhibited not only when the film is heat-treated argon gas but also when it is heat-treated under a high degree of vacuum condition ($3 \times 10^{-5}$ Torr).

Figure 12:
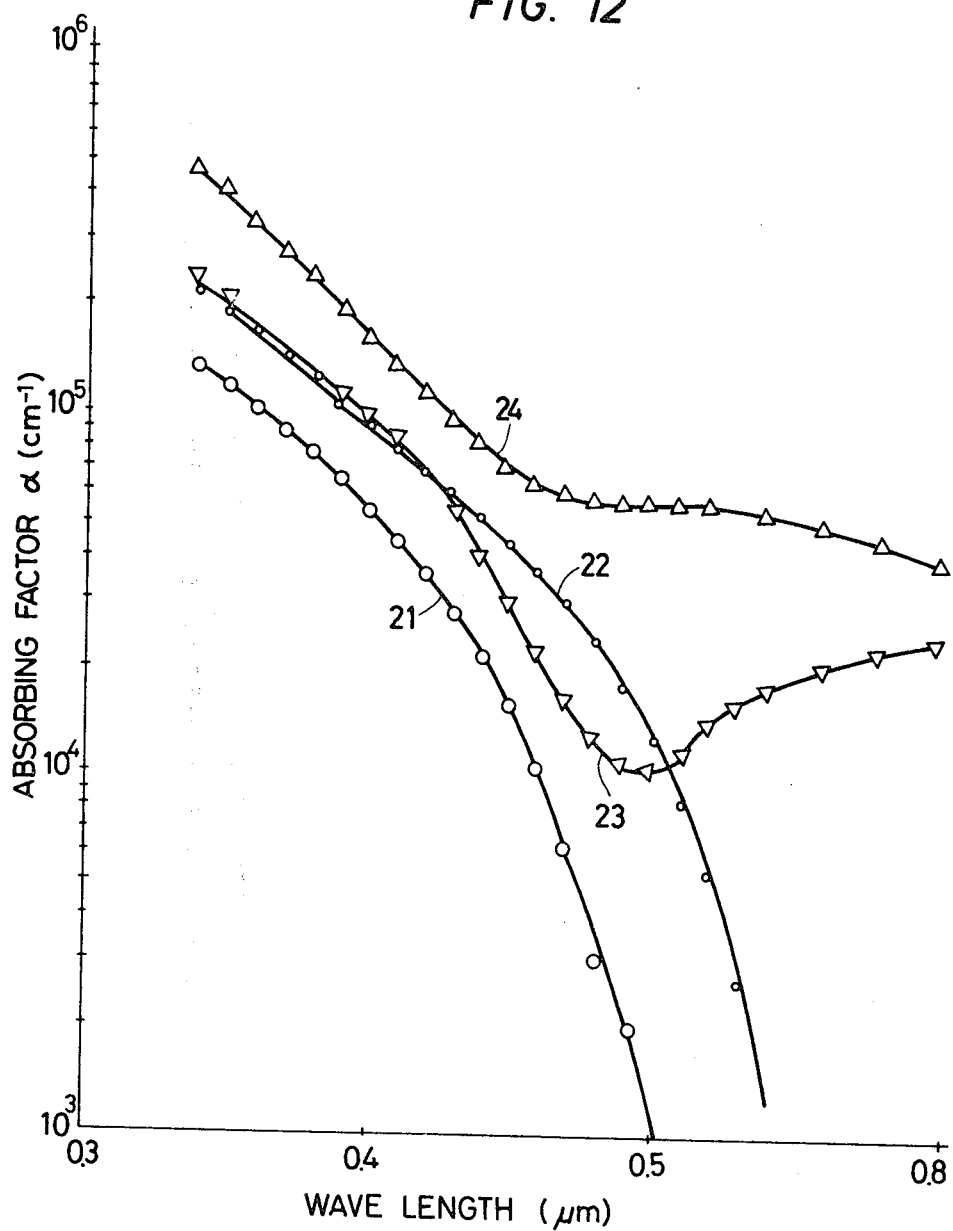
FIG. 12 is a graph illustrating a relation between the absorption coefficient and the wavelengths of the irradiated light.

(6) Partial pressure of oxygen and absorption coefficient:

Absorption coefficient α of light is calculated from the thus measured spectral transmission factor according to the below-mentioned relation. The results are shown in FIG. 12.

$$T = I/Io = \exp(-\alpha d)$$

$$\alpha = (\ln 1/T)/d$$

where T denotes a transmission factor, Io the intensity of incident light, I the intensity of transmitting light, and d denotes the thickness of the film.

Referring to FIG. 12, curves 21, 22, 23 and 24, respectively, represent characteristics which show the relations between wavelength and the absorption coefficient of the films sputtered in atmospheres (total gas pressure of $6.0 \times 10^{-3}$ Torr) in which the ratios of partial pressure of oxygen ($O_2/(Ar+O_2)$) are 100%, 50%, 20% and 2%. It will be understood from FIG. 12 that the transmission factor increases with increase of partial pressure of oxygen.

Figure 3C:
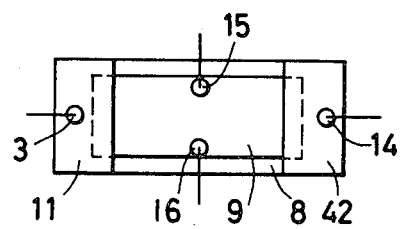

(7) Hall effect of Cd-Sn oxide film:

The Cd-Sn oxide films of the form shown in FIG. 3(c) were measured for their carrier concentration, carrier mobility and Hall constant under different partial pressures of oxygen, to determine the semiconductor properties. The results were as shown in Table below. The intensity of magnetic field was 6 to 8 KG. The specimens used here were used just after being sputtered and have not been heat-treated.

The dependence of resistivity upon the partial pressure of oxygen can be divided into two regions, with the partial pressure of oxygen of 3 to 20% as a boundary, as shown in FIG. 6. That is, in the region of 2 to 10% of oxygen partial pressure, the metal rich condition enables the film to possess high specific resistivity; the specific resistivity gradually decreases with the increase of the ratio of oxygen. In the region of 10 to 100% of oxygen partial pressure, on the other hand, the specific resistivity is increased as the atmosphere turns from the oxygen-deficient state to oxygen-rich state. As the oxygen partial pressure approaches 100%, the film acquires a stoichiometrical composition, i.e., the $Cd_2SnO_4$ acquires a resistivity close to that of an insulator. In practice, however, the composition of the thin film will be close to $Cd_2SnO_4$. The region of the abovesaid oxygen

TABLE 1

| | | | Electrical properties of Cd—Sn oxide films | | | | | | |
|---|---|---|---|---|---|---|---|---|---|
| | | | Specific resistivity | | | | | | |
| Sample No. | Resistance of sheet $\Omega/\square$ | Thickness of film Å | Sheet resistance x thickness of film $\Omega$-cm | Van der Pauw method $\Omega$-cm | Hall constant $cm^3/A$ sec | Hall mobility $cm^2/A$ sec | Carrier concentration $cm^{-3}$ | $O_2/Ar + O_2$ % | Type of conductivity |
| 1 | 363 | 245 | $8.89 \times 10^{-4}$ | $7.88 \times 10^{-4}$ | $2.32 \times 10^{-2}$ | 29.4 | $2.69 \times 10^{20}$ | 8 | N |
| 2 | 17.2K | 491 | $8.45 \times 10^{-2}$ | $7.05 \times 10^{-2}$ | 1.25 | 17.7 | $5.00 \times 10^{18}$ | 20 | N |
| 3 | 1613 | 1262 | $2.04 \times 10^{-2}$ | $1.38 \times 10^{-2}$ | $8.59 \times 10^{-2}$ | 6.2 | $7.28 \times 10^{19}$ | 50 | N |

Figure 13:
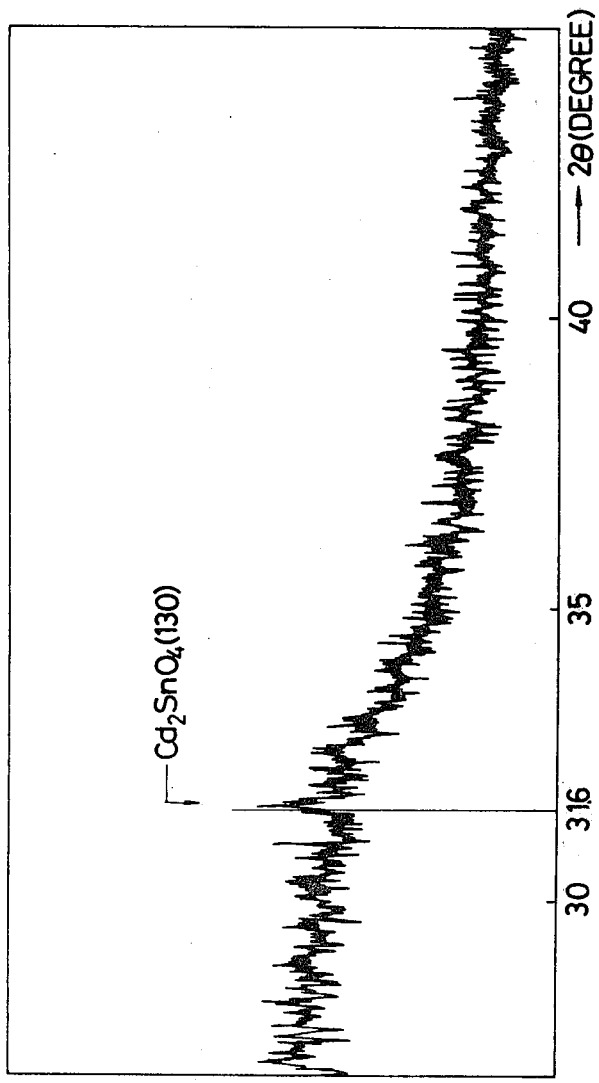
FIGS. 13 and 14 are graphs of X-ray diffraction patterns of the sputtered films.
Figure 14:
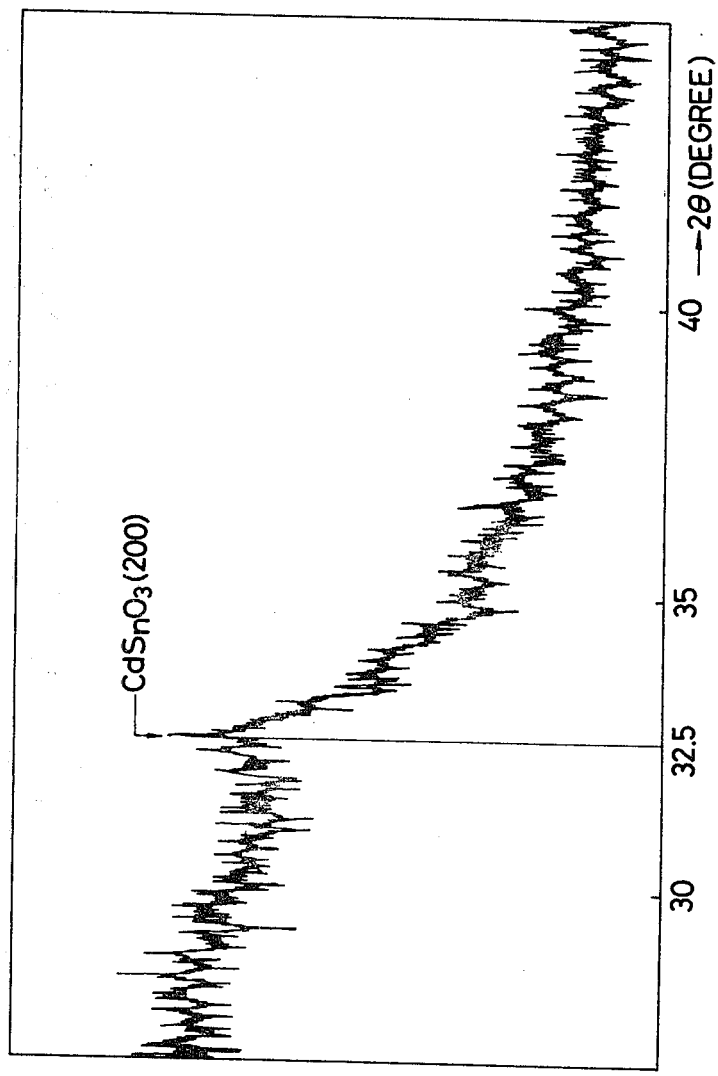

(8) Analysis of Cd-Sn oxide films:

The crystalline structure of the films were analyzed by way of the X-ray diffraction method and the electron diffraction method. The X-ray diffraction method revealed that the thin films on the glass substrate had been accumulated almost entirely in an amorphous state. Even if heat-treated at 300° C., the film remained in an amorphous state. As shown by the X-ray diffraction patterns of FIGS. 13 and 14 in which the partial pressure of oxygen was 29%, a peak of $Cd_2SnO_4$ (130) and a peak of $CdSnO_3$ (200) were observed.

On the other hand, a Cd-Sn oxide film of a thickness of less than 1000 angstroms was formed on an NaCl (001) substrate. Analysis by electron diffraction revealed the formation of amorphous $Cd_2SnO_4$ and polycrystalline $CdSnO_3$.

From the foregoing, it is considered that the transparent conductive films composed of Cd-Sn oxide according to the present invention are made up of a mixture of $Cd_2SnO_4$ and $CdSnO_3$.

Figure 15:
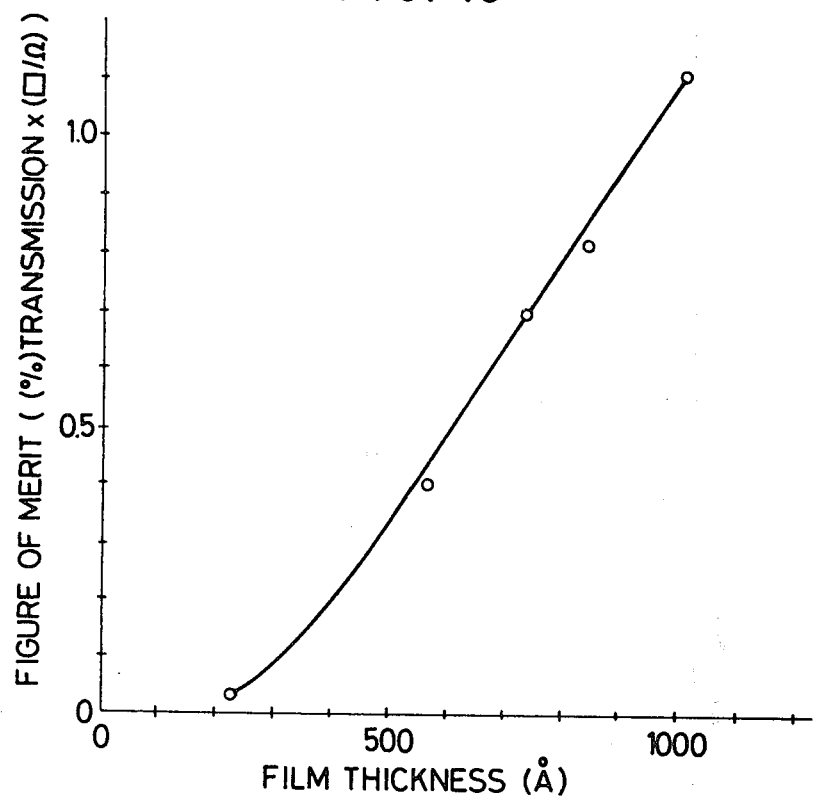
FIG. 15 is a characteristic diagram for illustrating the figure of merit of the transparent conductive film with respect to the thickness of the film.

In the foregoing concrete embodiments of the present invention along with measured results of various characteristics were described. However, from the standpoint of practical electronic devices, it is desirable to select the thickness of the film within the order of microns as, seen from the relation between the thickness of the transparent conductive film and the figure of merit shown in FIG. 15. When the thickness of the film is not greater than 1000 angstroms, the figure of merit increases with the increase of the film thickness, as shown in FIG. 15. That is, the transparent conductive film should desirably have a large value of figure of merit.

Figure 16:
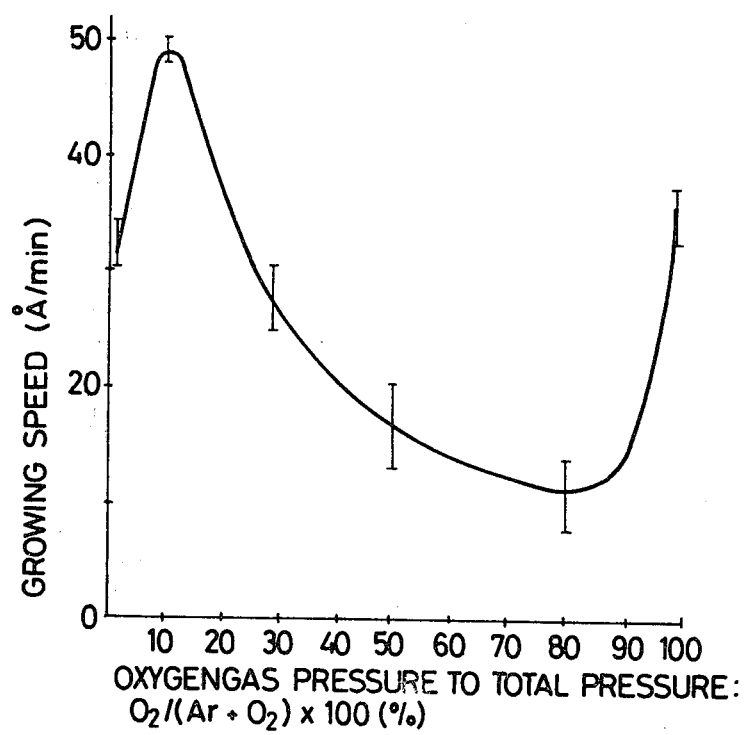
FIG. 16 is a graph illustrating a relation between the partial pressure of oxygen and the rate of accumulation of the sputtered film.

FIG. 16 shows a relation between the partial pressure of oxygen and the rate of film accumulation. The appearance of such a relation is attributed to the probability of cations being formed during the electrical discharge is dependent upon the ratio of oxygen. If the ratio of oxygen increases, a reaction takes place between the sputtered atoms and oxygen, causing the rate of accumulation to be decreased.

partial pressure of 3 to 20% lies between these two regions, and represents a so-called transition region in which are present the heretofore described two modes. Therefore, the specific resistivity of the film is considered to have relatively small variation with respect to the variation in oxygen partial pressure, so that the value of the specific resistivity is confined in a minimal range. The above consideration in regard to the transition region can also be applied when a metal oxide other than the Cd-Sn oxide film is to be sputtered or when a Cd-Sn alloy member of a composition other than Cd/Sn=2/1 is to be used as a target material.

The following can be recognized from the aforementioned various experimental results.

(1) A good transparent conductive film is obtained by d-c dipolar sputtering using an alloy target of Cd/Sn=2/1.

(2) The specific resistivity of the sputtered film formed in a mixture of inert gas Ar and active gas $O_2$ in the sputtering vessel can be controlled to a desired value. Particularly, when the oxygen partial pressure was set at 3 to 20%, a transparent conductive film was formed having a small specific resistivity of the order of $10^{-4}$ $\Omega$-cm and a transmission factor of about 90% for light having a wavelength of 500 nm.

(3) The resistivity and transmission factor of the film can be improved by heat-treating the sputtered film formed by the abovementioned reactive sputtering method in argon gas or under a vacuum condition.

(4) A transparent conductive film was obtained having a conductivity that has little dependence upon the temperature in a range lower than room temperature.

(5) The analysis by X-ray diffraction of the Cd-Sn oxide film prepared by the reactive sputtering method revealed peaks attributable to $Cd_2SnO_4$ (130) and $CdSnO_3$ (200), and the analysis of the film accumulated on NaCl (001) substrate by electron diffraction revealed the formation of amorphous $Cd_2SnO_4$ and polycrystalline $CdSnO_3$.

(6) According to the present invention, a transparent conductive film was obtained that was up of a mixture of $Cd_2SnO_4$ and $CdSnO_3$.

As will be understood from the foregoing description, according to the present invention, it is possible to prepare a transparent conductive film of an oxide semiconductor by the reactive cathode sputtering method using a target of an alloy composed of two or more metal elements, applying a d-c voltage across the anode and the cathode in a gas mixture consisting of an inert gas and an active gas, and allowing a sputtered substance to be accumulated on the substrate thereby to prepare a thin film.

The preparation of a thin film according to the present invention is based on the following two fundamental principles. One principle is that in the reactive cathode sputtering, the positive ions of the inert gas collide with the surface of a target made of a metal or an alloy, causing the neutral atoms in the target to be sputtered, whereby the sputtered atoms undergo a chemical reaction with active gas molecules to form a compound which is accumulated on the substrate thereby forming a thin film. Another principle is that the properties of an oxide semiconductor, particularly the photoelectrical properties, are dependent upon the composition of metal atoms and oxygen atoms, and are characterized by a stoichiometrical composition and the degree of deviation from the stoichiometrical composition.

The present invention based upon these principles presents marked advantages over the prior methods. First, in preparing a transparent conductive film of an oxide semiconductor having desired characteristics, it is possible to freely select the composition of the target material, and to freely select the mixing ratio of the active gas and inert gas in the discharging atmosphere and the total pressure. Second, the desired characteristics can be materialized by simply accumulating the film under predetermined sputtering conditions without needing to after-treat the accumulated film with heat in a reducing or oxidizing atmosphere that is employed by the conventional methods. In other words, no after-treatment with heat is required to achieve the stoichiometrical composition of the film or the deviation.

Another advantage is that the target can be easily prepared, the apparatus for preparing the film can be easily operated while requiring easy maintenance, and further the apparatus can be cheaply maunfactured. According to the conventional methods, the target was prepared from a powder of metal oxide and, hence, a complicated procedure was required for preparing the tablets. In addition, the oxide was easily decomposed upon the collision by positive ions, making it difficult to achieve the films having the desired composition. The reactive cathode sputtering apparatus, on the other hand, is simple in principle and construction as compared with the high-frequency a-c sputtering devices. According to the present invention, therefore, it is very advantageous to include the step of manufacturing the transparent conductive film in the step of manufacturing photoelectric devices, thereby contributing to reduce the manufacturing cost of transparent electrodes and providing very great industrial significance.

Figure 17:
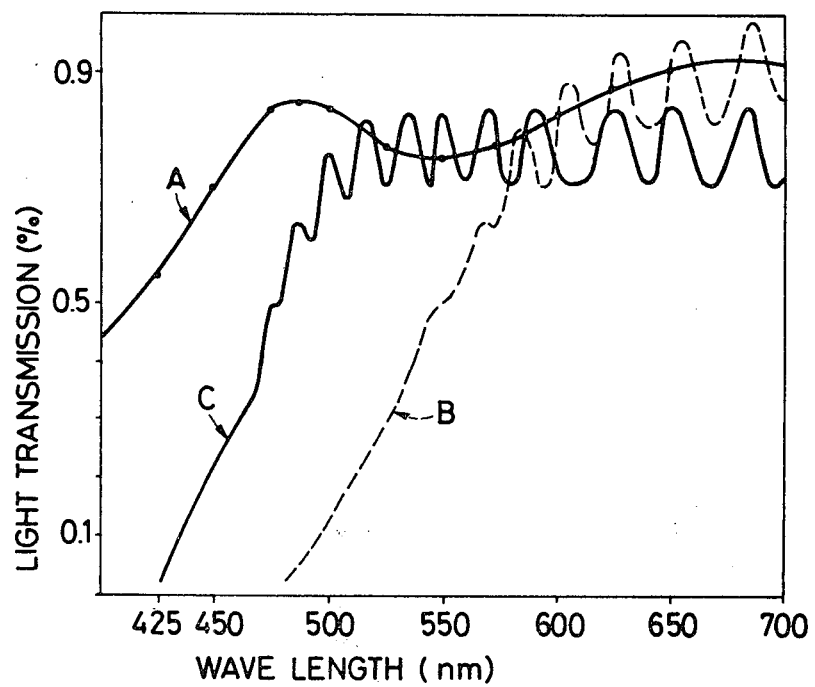
FIG. 17 is a graph of the spectral transmission factor of light of transparent conductive films obtained by various methods.

FIG. 17 is a graph of characteristics for illustrating the spectral transmission factor of a transparent conductive film prepared according to the abovementioned method of the present invention in comparison with the spectral transmission factor of the film prepared by a conventional method before and after heat-treatment.

In the drawing, symbol A shows the measured results of transmission factor of the transparent conductive film prepared according to the present invention, and symbols B and C represent the measured results of transmission factors of a film prepared by a conventional method before and after heat-treated in hydrogen gas. From FIG. 17, it will be understood that the spectral transmission factor of the film according to the present invention is also superior in the region of visible light to the films obtained by the conventional method.

Illustrated below in more detail is the method of producing the thin films by the reactive sputtering method using an alloy target according to the present invention. The transparent conductive film is produced by the reactive cathode sputtering method using a customarily employed cathode sputtering apparatus powered by a d-c supply. FIG. 2 shows the principle of the apparatus for producing the transparent conductive film according to the present invention, in which reference numeral 1 represents a vessel made of a glass or a metal for producing electrical discharge under vacuum condition, reference numeral 2 denotes an anode made of a metal which works to maintain a positive d-c potential of higher, for example, than 1 kilovolt, and reference numeral 3 represents a cathode made of a metal on which is placed a plate-like target 4 of an alloy composed of metals for forming the transparent conductive film. The cathode is maintained at a negative d-c potential, and the target is maintained nearly at the same potential.

Reference numeral 5 designates a vacuum valve which is connected to an exhaust device such as oil-diffusion pump or trap to take out the gases from the vessel 1, 6 a leak valve for introducing the inert gas into the vessel in a steadily flowing manner after the air in the vessel 1 has been taken away to create a high degree of vacuum, 7 a leak valve for introducing the active gas into the vessel 1 in a steadily flowing manner, 8 a substrate for forming the sputtered film consisting of a glass plate for accumulating the transparent conductive film or a silicon wafer of a photoelectric device having a PN junction on its main surface, 9 a transparent conductive film accumulated on the substrate, and reference numeral 10 designates a shutter for preventing the surface of the substrate from being fouled before the film is accumulated thereon.

Using the apparatus of FIG. 2, the transparent conductive film can be produced by the following procedure. First, the target 4 is secured on the cathode 3, and the substrate 8 is fastened to the lower surface of the anode 2 using a suitable holder fitting. The operation consists of starting the exhaust device, and opening the vacuum valve 5 to take out the air from the vessel 1 to establish a vacuum state of a pressure of smaller than $10^{-5}$ Torr in the vessel 1. Then an inert gas such as argon which will be used for sputtering the target material is introduced into the vessel 1 by opening the leak valve 6. Further, the leak valve 7 is opened to introduce an active gas such as oxygen. The total pressure of gases introduced will be about $10^{-2}$ Torr.

With the apparatus being placed under such a condition, a d-c voltage is applied across the anode and the cathode. The clearance between the anode and the cathode will be several centimeters. The surface of the substrate is covered with a shutter until a suitable period of time has passed after the electrical discharge is started. If the shutter is opened, the metal atoms are sputtered from the alloy target of a predetermined composition; the sputtered atoms react with the active gas to form an oxide which will be accumulated on the substrate thereby to form a film.

The composition of the accumulated film is determined by the alloy composition forming the target, the composition of gas mixture in the vessel and the total pressure of the gases. Therefore, when the inert gas only is introduced, the alloy film is accumulated on the substrate. When both the inert gas and the active gas are introduced, an insulating substance of a composition dependent upon the mixing ratios of gases or a film of an oxide semiconductor is accumulated on the substrate. Accordingly, the electrical resistance of the accumulated film ranges from a value of resistance of the alloy up to a value of resistance of an insulator. Further, the transmission factor of the film with respect to the visible light lies over a range of from opaque region to transparent region. Below is illustrated in more detail the invention with reference to concrete examples.

EXAMPLE 1

An alloy composed of a cadmium metal and a tin metal of an atomic composition ratio of 2 to 1 is used as a target material. The target material is made in the form of a disc of a diameter of 75 mm and a thickness of 3 mm, and is secured on a circular cathode of a diameter of 75 mm. A hard glass plate is used as a substrate for the transparent conductive film and is attached to the lower surface of the anode. The distance between the anode and the cathode is set at 57 mm, and the air in the vessel is exhausted to a vacuum of $2 \times 10^{-6}$ Torr to purge the interior of the vessel. Then a mixture gas consisting of 80% of argon gas and 20% of oxygen gas is introduced to maintain the total pressure at $3 \times 10^{-2}$ Torr.

If the temperature of the substrate is maintained at 200° C. and a d-c voltage of 2 kilovolts is applied between the anode and the cathode, an electrical discharge occurs. Further, if the shutter is opened, the film starts to accumulate on the substrate. If the discharge is continued with a cathode current of 7 mA for 60 minutes, a film of a thickness of 3000 angstroms is formed. The film is an oxide semiconductor having a composition close to the stoichiometrical composition composed of cadmium oxide and tin oxide, and exhibits a surface resistivity of 40 ohms per unit area at room temperature and a transmission factor of 85% for light of the visible region.

EXAMPLE 2

An alloy target of the same composition as that of Sample 1 is used, and nitrogen is introduced as an inert gas into the vessel. The mixing ratio of nitrogen to oxygen is set at 4 to 1, and the resultant pressure is set at $5 \times 10^{-2}$ Torr, followed by the application of a d-c voltage of 3 kilovolts across the electrodes. The substrate temperature is maintained at 180° C., and a discharge is continued for 60 minutes with the cathode current of 35 mA; a film of a thickness of 650 angstroms is accumulated or formed on the substrate. The area resistivity of the film is 160 ohms per unit area. The film exhibits a spectral transmission factor of about 90% over a range of wavelengths from the visible light region to the infrared ray region.

EXAMPLE 3

A transparent conductive film is prepared under the same sputtering conditions as those of Example 1, using, as a target material, a ternary alloy consisting of cadmium, tin and indium at an atomic ratio of 3:1:0.2. There is obtained a film having a thickness of 700 angstroms, a surface resistivity of 400 ohms and transmission factor of 90% for visible light.

As will be obvious from the foregoing description, it is possible to easily produce a transparent conductive film of an oxide semiconductor having desired photoelectrical characteristics on an industrial scale eliminating the defects inherent in the conventional methods, by the method of reactive d-c sputtering using a binary or a ternary alloy or an alloy having more than three elements, changing the composition of the inert gas for sputtering the metals of the target and the active gas for forming the compound to arbitrarily control the photoelectrical characteristics of the film.

As mentioned earlier, the transparent conductive films were usually used as electrodes of photoelectrical devices and optical devices or as semitransparent mirrors, and were so far produced by a chemical method or a physical method. The transparent conductive film composed of oxides of tin and antimony is now most widely used, and is prepared by spraying onto a heated substrate a solution containing chlorides of tin and antimony. Such a chemical spray method, however, is not applicable to the photoelectric devices which require transparent electrodes of fine shapes.

A physical method is employed for the manufacture of photoelectrical electrodes of solid image pickup devices which are finely constructed, and a transparent electrode composed chiefly of an indium oxide is produced by a high-frequency a-c sputtering method. It was attempted to apply a similar method for the manufacture of an oxide semiconductor ($Cd_2SnO_4$) having the stoichiometrical composition of cadmium oxide and tin oxide. According to such a method, however, tablets formed by molding with pressure and sintering the powder of metal oxides (that are components of the transparent conductive film) had to be used for forming the target, and a high-frequency a-c voltage must be applied across the two electrodes so that a thin film of metal oxides was accumulated on the substrate by the electrical discharge in the oxygen gas. With this method therefore, a clumsy operation was required for preparing the tablets as mentioned earlier, and it was difficult to improve the photoelectrical properties of the thin film while maintaining stability and reproduceability.

According to the reactive sputtering method employing an alloy target of the present invention, it is possible to eliminate various problems as mentioned in the foregoing, and to effectively produce general-purpose thin films in addition to the transparent conductive films.

What is claimed is:

1. A transparent and electrically conductive film consisting essentially of a mixture of $Cd_2SnO_4$ and $CdSnO_3$.

2. A transparent and electrically conductive film according to claim 1, wherein said film has a specific resistivity on the order of $10^{-3}$ $\Omega$-cm to $10^{-4}$ $\Omega$-cm.

3. A structure comprising a substrate, a transparent film comprising a mixture of $Cd_2SnO_4$ and $CdSnO_3$ formed on the surface of said substrate, and an electrode connected to said transparent film.

4. The structure according to claim 3, wherein said film has a specific resistivity of not more than $10^{-3}$ $\Omega$-cm.

5. A transparent and electrically conductive film according to claim 1, wherein said film consists essentially of a mixture of amorphous $Cd_2SnO_4$ and polycrystalline $CdSnO_3$.

6. A transparent and electrically conductive film according to claim 5, wherein said film was prepared by a sputtering process in which a target containing an alloy of cadmium and tin is placed in a gas mixture consisting essentially of an inert gas and an oxygen gas having an oxygen partial pressure of 3 to 20% and an electrical discharge is caused to take place in said gas mixture under the application of a high voltage electric field.

7. A transparent and electrically conductive film according to claim 6, wherein said target is an alloy of cadmium and tin in a molar ratio of 2 to 1.

8. A transparent and electrically conductive film according to claim 1, wherein said film exhibits a spectral transmission factor of about 90% for a light in the visible light region.

* * * * *